United States Patent
Pulvirenti et al.

[19]

[11] Patent Number: 5,831,466
[45] Date of Patent: Nov. 3, 1998

[54] PROTECTION METHOD FOR POWER TRANSISTORS, AND CORRESPONDING CIRCUIT

[75] Inventors: Francesco Pulvirenti, Acireale; Gregorio Bontempo, Barcellona P.G.; Roberto Gariboldi, Lacchiarella, all of Italy

[73] Assignee: SGS Thomson Microelectronics S.r.l., Italy

[21] Appl. No.: 777,182

[22] Filed: Dec. 27, 1996

[30] Foreign Application Priority Data

Dec. 29, 1995 [EP] European Pat. Off. ............ 95830550.0

[51] Int. Cl.$^6$ .......................... H03K 17/082; H02H 1/00
[52] U.S. Cl. ..................... 327/309; 327/310; 327/312; 327/314; 327/320; 327/194; 327/322; 326/538
[58] Field of Search ............................. 365/227; 327/310, 327/309, 312, 314, 320, 194, 322; 326/538

[56] References Cited

U.S. PATENT DOCUMENTS

| | | | |
|---|---|---|---|
| 4,679,112 | 7/1987 | Craig | 361/33 |
| 4,910,635 | 3/1990 | Gilliland | 365/159 |
| 4,979,067 | 12/1990 | Foley | 361/18 |
| 5,136,231 | 8/1992 | Faulk | 320/31 |
| 5,495,165 | 2/1996 | Beland | 323/270 |

FOREIGN PATENT DOCUMENTS

| | | |
|---|---|---|
| 0 363 020 | 4/1990 | European Pat. Off. . |
| 0 499 921 | 8/1992 | European Pat. Off. . |
| 0 514 064 | 11/1992 | European Pat. Off. . |
| 0 579 561 | 1/1994 | European Pat. Off. . |

*Primary Examiner*—Viet Q. Nguyen
*Attorney, Agent, or Firm*—Michele A. Mobley; Jenkens & Gilchrist

[57] ABSTRACT

The present invention is aimed at providing a method and a circuit for protecting the output stage of a power actuator against voltage transients of the surge type. In particular, it provides protection against voltage surge transients of the kind described by International Standard IEC 801-5, for a power transistor contained in the output stage of the actuator.

The method of this invention provides for:

the utilization of the power transistor (PW) intrinsic diode (DP) for dumping the transient energy to one of the supply generator terminals during a positive transient; and the utilization of the power transistor (PW) restoration feature to the on state for dumping the energy thereinto during a negative transient, while simultaneously inhibiting the current limiting function.

The power transistor (PW) is turned on again, and the current limiting circuit (4) inhibited, by the following steps:

a) generating an electric signal which is substantially proportional to the voltage appearing at the output terminal (OUT) of the actuator;

b) driving the control terminal (G) of the power transistor (PW) by means of said electric signal, and causing said transistor to conduct, while simultaneously disabling the current limiting circuit (4) when the output voltage exceeds a predetermined threshold; and c) allowing the transient energy to be dissipated to the power transistor (PW).

10 Claims, 4 Drawing Sheets

PROTECTION METHOD FOR POWER TRANSISTORS, AND CORRESPONDING CIRCUIT

TECHNICAL FIELD OF THE INVENTION

The present invention relates to a method and a circuit for protecting the output stage of a power actuator against voltage transients of the surge type. In particular, it provides protection against voltage surge transients of the kind described by International Standard IEC 801-5, for a power transistor contained in the output stage.

BACKGROUND OF THE INVENTION

The need for this arises from a steady demand for more reliable safeguarding measures. In addition, the application of extensive miniaturization technologies to the manufacture of devices and the expanding use of CMOS transistors, which are more vulnerable than bipolar transistors, have led to the need for worldwide standardization of the methods used to evaluate the performance, reliability and immunity to noise of systems.

Affected in particular by a noisy environment are industrial and automotive applications, wherein the noise sources are commonly traced to resonant circuits, the operation of switches and, wherever links are established through transmission lines, to high-energy voltage pulses being induced along the cables by certain weather factors, such as lightnings.

IEC Standards are aimed at providing a common basis for measuring such noise sources, for reproducing them at the lab, as well as for assessing the performance and reliability of a device being tested.

Listed below are the most commonly occurring types of noise, along with the respective standards that rule their emission and immunity levels:

| | |
|---|---|
| Electrostatic discharge | IEC 801-2 |
| Electromagnetic interference | IEC 801-3 |
| Burst-type transients | IEC 801-4 |
| Surge-type transients | IEC 801-5 |

As is known, electrostatic discharges produce the fastest and shortest-duration pulses, while surge transients are the most energetic and, for this very reason, are the most likely to endanger the circuit integrity.

Surge transients usually originate from two types of sources, namely:

changeover sources, such as switches, relays, switching resonant circuits, or shorts; and phenomena, such as arching and lightning, which produce strong electrostatic discharges, whose noise usually propagates by inductive coupling with the transmission lines.

Normally—and with the exception of the device power supply and ground pins, which are affected by all kinds of strains and, accordingly, always protected against surge transients—not all of the other pins are affected by the transients, so that it is not always necessary to protect them.

For example, for actuators used in automation chains, protection is required for the power outputs only, these outputs being interfaced to the outside by transmission lines up to 400 meters long in which surge transients are induced.

The technique currently employed to protect devices from surge transients consists of connecting discrete transient suppressors, i.e. suppressors external of the devices, to the pins to be protected. No alternative circuit arrangement previously have been known that can be integrated on the same chip, thereby making external suppressors unnecessary.

As mentioned above, on actuators for industrial and automotive applications, besides the power supply and ground pins, it is only the output pins that are subjected to strains of the surge type and need to be protected.

To protect such pins, it has been common practice to limit the voltage to such pins by providing externally connected transient suppressors.

Figure 1:
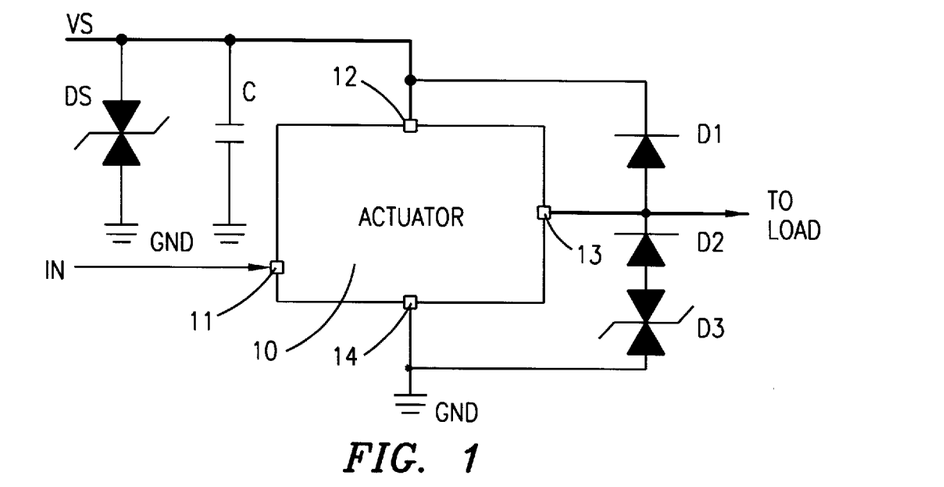
FIG. 1 is a diagram showing schematically a power actuator as protected with discrete transient suppressors.

Shown in FIG. 1 is a known circuit design for a power actuator. An actuator 10 has a first power supply pin 12 connected to a voltage supply line VS, and a second power supply pin 14 connected to ground GND. The first power supply pin 12 is protected by a bi-directional zener diode DS whose cut-off voltage is higher than the working voltage of the actuator 10 but lower than the actuator 10 breakdown voltage. Alternatively, the zener diode DS could be a uni-directional one. Noise attenuation is further assisted by a filter capacitor C.

The actuator 10 has an input pin 11 through which an input signal IN is applied. The actuator 10 also has an output pin 13. The output pin 13 is protected by diodes D1, D2 and D3. The diode D1 dumps the positive pulse energy into the voltage supply line VS, while the diodes D2 and D3 dump the negative pulse energy to ground GND. The diode D3 is a bidirectional zener diode, but may be unidirectional, and is provided to allow the voltage at the output pin 13 to go subground and enable fast de-magnetization of any inductive loads.

The underlying technical problem of this invention is to protect a power actuator output from surge transients, using a circuit arrangement which can be fully integrated and involves no external components.

This technical problem is solved by a method for protecting an output terminal of a power actuator, as further described below.

The technical problem also is solved by a final stage of a power actuator, having its output protected against voltage transients, as further described below.

SUMMARY OF THE INVENTION

The present invention is aimed at providing a method and a circuit for protecting the output stage of a power actuator against voltage transients of the surge type. In particular, it provides protection against voltage surge transients of the kind described by International Standard IEC 801-5, for a power transistor contained in the output stage of the actuator.

The method of this invention provides for:

the utilization of the power transistor (PW) intrinsic diode (DP) for dumping the transient energy to one of the supply generator terminals during a positive transient; and the utilization of the power transistor (PW) restoration feature to the on state for dumping the energy thereinto during a negative transient, while simultaneously inhibiting the current limiting function.

The power transistor (PW) is turned on again, and the current limiting circuit (4) inhibited, by the following steps:

a) generating an electric signal which is substantially proportional to the voltage appearing at the output terminal (OUT) of the actuator;

b) driving the control terminal (G) of the power transistor (PW) by means of said electric signal, and causing said transistor to conduct, while simultaneously disabling the current limiting circuit (4) when the output voltage exceeds a predetermined threshold; and c) allowing the transient energy to be dissipated to the power transistor (PW).

The features of this invention can be more clearly appreciated from the following detailed description of embodiments thereof, given with reference to the accompanying drawings.

DETAILED DESCRIPTION OF THE INVENTION

Figure 2:
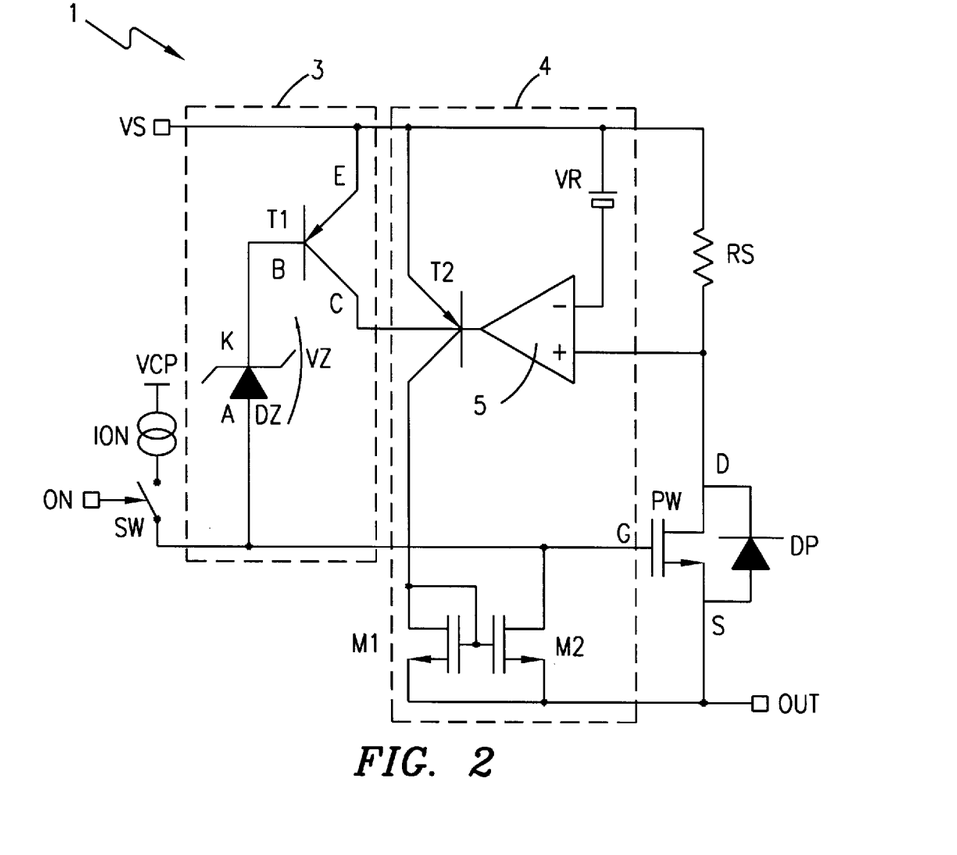
FIG. 2 is a circuit diagram of a first final stage of a power actuator, internally protected from voltage transients, according to this invention.

Shown in FIG. 2 is a first embodiment of a final stage 1 of a power actuator, protected against voltage transients, in accordance with this invention. The circuit 1 is a final stage of an actuator of the "high-side" type, in which the power transistor is utilized for supplying a positive voltage to a load.

The following components can be recognized in the circuit diagram:

a power transistor PW of the MOS type, with an intrinsic diode DP to the transistor structure also being shown which is connected electrically between the source terminal S and the drain terminal D;

a resistor RS intended for sensing a short-circuit current, placed in series with the drain-source main conduction path of the power transistor;

a limiter circuit 4 for limiting the largest output current from the final stage, consisting of a reference generator VR, an operational amplifier 5, a bipolar transistor T2 of the PNP type, and a current mirror with MOS transistors M1, M2;

a power-on circuit for the power transistor PW, which comprises a current generator ION and a switch SW; and a power-up circuit 3 for restoring the power transistor PW to the on state, which circuit comprises a zener diode DZ and a bipolar transistor T1 of the PNP type.

The power transistor PW has a control or gate terminal G, a first main conduction or drain terminal D, and a second main conduction or source terminal S.

The first D and second S main conduction terminals describe a main conduction path D-S which is connected, in series with the sense resistor RS, between a positive pole VS of a power supply generator and the output node OUT of the actuator. The gate terminal G of the transistor PW is connected, through a switch SW, to the current generator ION, the latter being connected, in turn, to a second positive pole VCP of the power supply generator. The switch SW is an electronic switch controlled by means of a power-up signal ON.

The limiter circuit 4 for limiting the maximum output current from the transistor PW comprises an operational amplifier 5 which has a non-inverting input connected to the common node between the resistor RS and the drain terminal D of the transistor PW and an inverting input connected to a first terminal of the reference generator VR. A second terminal of the generator VR is connected to the other end of the resistor RS. The output of the operational amplifier 5 is connected to the base of the transistor T2, the emitter of the transistor T2 being connected to the positive pole VS and its collector connected to an input leg of the current mirror M1, M2. The mirror MI, M2 is formed of two MOS transistors, of which a first transistor M1 forms the input leg and a second transistor M2 forms the output leg through which the mirrored current is passed. The source terminals of either transistors M1 and M2 are connected together and to the output node OUT of the actuator, and the drain terminal of the second transistor M2 is connected to the gate terminal G of the power transistor PW.

The power-up circuit 3 comprises a transistor T1 having an emitter terminal connected to the positive pole VS of the power supply generator, a collector terminal connected to the base terminal of the transistor T2, and a base terminal connected to the cathode of the zener diode DZ; the anode of the diode DZ being connected to the gate terminal G of the power transistor PW.

The principle on which the final stage 1 of FIG. 2 operates will now be described. During normal operation, the final stage is controlled by means of the signal ON acting on the switch SW to put the power transistor PW into conduction. The resistive value of the resistor RS placed in series with the main conduction path D-S of the transistor PW is of a few tens milliohms, and produces a voltage drop which is negligible as concerns the circuit operation, but forms a sufficient input signal to the maximum current limiting circuit 4.

The operational amplifier 5 contained in the limiter circuit 4 compares the voltage drop across the resistor RS with the voltage of the reference generator VR and, when this voltage exceeds the reference voltage, causes the transistor T2 to conduct. The transistor T2 forces a current into the input leg of the current mirror M1, M2, which current is mirrored into the output leg of transistor M2. The current passed into the transistor M2 causes a decrease in the voltage across the drain and the source of the transistor M2, and accordingly, in the gate-to-source voltage Vgs of the transistor PW. Under this condition, the transistor PW goes off, thereby limiting the output current.

The power-up circuit 3 functions to turn on the power transistor PW again, upon the voltage Vout at the output terminal dropping below a given threshold, usually a negative one relative to ground, past which the potential difference between the output terminal OUT and the supply terminal can damage the integrated structure beyond recovery. This function is normally utilized to turn on the transistor again, and to provide for fast de-magnetization of the inductive loads. In fact, where the actuator is driving an inductive load, the energy stored up in the load produces a voltage peak at the actuator terminal OUT upon opening the transistor. The operation of the power-up circuit causes the energy stored in the load to be dumped into the transistor PW, and the voltage Vout at the output terminal to remain limited.

Advantageously, the power-up circuit 3 is coupled to the current limiting circuit 4 so as to cut off the current limiting function on the transistor being turned on again.

In particular, if the voltage Vout at the output terminal drops below a given threshold VL, as given by the following formula $$VL = VS - (Vgs + VZ + Vbe),$$

where,

VS is the supply voltage to the actuator, typically 24 volts,

Vgs is the gate-source voltage of the power transistor, which can be estimated at around 5-volt in normal operation, and Vbe is the base-emitter voltage of the transistor T1, then a current begins to flow through the zener diode DZ, and the transistor T1 goes into the conducting state.

Under this condition, the zener diode DZ turns on the power transistor PW, and simultaneously therewith, the transistor T1 disables the limiter circuit 4.

The circuit operating principle, on the occurrence of a voltage transient at the output terminal, is the following.

During a positive surge transient, i.e. as the output OUT attains a higher potential than the supply voltage VS, with the transistor PW in either the on or the off state, the transient energy is dumped into the supply line via the intrinsic diode DP of the power transistor PW.

During a negative surge transient, the following takes place. If the power transistor PW is in the off state, the voltage at the output OUT drops down to the operation voltage of the zener diode DZ, which functions to turn on again the power transistor at subground voltage for fast de-magnetization in the instance of the load being inductive. The current required by the surge transient being, however, larger than the limited current, lacking the transistor T1, the output voltage would keep dropping to the breakdown level, past which the device is destroyed. By providing the transistor T1, the current limiting function can be disabled upon the output dropping to a voltage VL=VS−(Vgs+VZ+Vbe), so that the power transistor PW can supply all the current required by the surge transient and dissipate the energy thereto.

If the power transistor PW is on when the surge transient occurs, the current limiting circuit 4 tends to turn off the transistor PW, and the output OUT is restored to subground. By the provision of the transistor T1 to disable the current limiting function, it can be arranged for the voltage at the output OUT to never drop below VL=VS−(Vgs+VZ+Vbe). Once again, the power transistor PW will supply all the current required by the surge transient and dissipate the transient energy.

Figure 3:
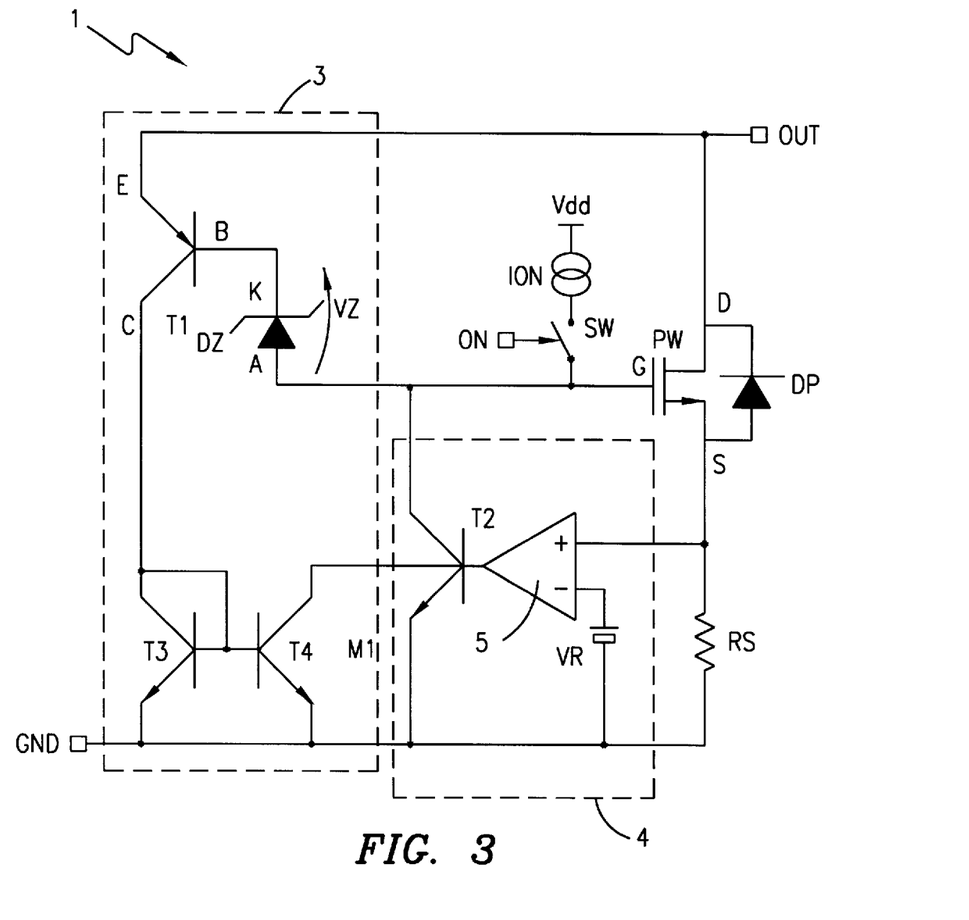
FIG. 3 is a circuit diagram of a second final stage of a power actuator, internally protected from voltage transients, according to this invention.

Shown in FIG. 3 is a second embodiment of a final stage of a power actuator protected from voltage transients, according to the invention.

The circuit 1 of FIG. 3 is a final stage of an actuator of the "low-side" type, wherein the power transistor is utilized for connecting a load to a ground voltage reference.

The following component parts can be recognized on the circuit diagram:

- a power transistor PW of the NOS type, including a diode DP which is intrinsic to the transistor structure and connected electrically between the source terminal S and the drain terminal D;
- a resistor RS for sensing a short-circuit current, which is placed in series with the drain-source main conduction path of the power transistor;
- a limiter circuit 4 for limiting the maximum current from the final stage and comprising a reference generator VR, an operational amplifier 5, and a bipolar transistor T2 of the NPN type;
- a power-on circuit for the power transistor PW, which comprises a current generator ION and a switch SW;
- a power-up circuit 3 for turning on the power transistor PW again, which comprises a zener diode DZ, a bipolar transistor T1 of the PNP type, and a current mirror circuit T3, T4.

The main conduction path D-S of the power transistor PW is connected, in series with the sense resistor RS, between the output node OUT of the actuator and the ground voltage reference GND. The gate terminal G of the transistor PW is connected, through the switch SW, to the current generator ION, the latter being in turn connected to a positive pole Vdd of a supply generator. The switch SW is an electronic switch controlled by means of a power-up signal ON.

The limiter circuit 4 for limiting the maximum current from the transistor PW comprises an operational amplifier 5 having a non-inverting input connected to the common node between the resistor RS and the source terminal S of the transistor PW, and an inverting input connected to a first terminal of the reference generator VR; a second terminal of the generator VR is connected to the other end of the resistor RS. The output of the operational amplifier 5 is connected to the base of the transistor T2; the emitter of this transistor is connected to the ground reference GND, and its collector is connected to the gate terminal G of the power transistor PW.

The power-up circuit 3 comprises a transistor T1 having its base terminal connected to the cathode of the zener diode DZ, it emitter terminal connected to the output node OUT of the actuator, and its collector terminal connected to an input leg of the current mirror circuit T3, T4. The mirror T3, T4 consists of two bipolar transistors of the NPN type: a first transistor T3 forming the input leg, and the second transistor T4 forming the output leg through which the mirrored current is passed. The emitter terminals of either transistors T3, T4 are connected together and to the ground reference GND, and the collector terminal of the second transistor T4 is connected to the base of the transistor T2 in the current limiting circuit 4.

The principle of operation of the final stage 1 in FIG. 3 is similar to the operation of the previously described circuit in FIG. 2.

During normal operation, the final stage is controlled by means of the signal ON acting on the switch SW to cause the power transistor PW to conduct. The operational amplifier 5 contained in the limiter circuit 4 compares the voltage drop existing across the sense resistor RS with the voltage of the reference generator VR, and when that voltage exceeds the reference voltage, causes the transistor T2 to conduct. The transistor T2, once conducting, will tend to turn off the power transistor PW, thereby limiting the output current.

The power-up circuit 3 functions to turn on the power transistor PW again upon the voltage Vout at the output terminal exceeding a given threshold past which the potential difference between the output terminal OUT and the ground reference GND may inflict permanent damage on the integrated structure. Normally, this function is utilized to provide for faster de-magnetization of inductive loads. In fact, where the actuator is driving an inductive load, the energy stored up in the load with the transistor PW in the open state, produces a voltage peak at the actuator terminal OUT. The operation of this power-up circuit causes the energy stored in the load to be dumped into the transistor PW, and the voltage Vout at the output terminal to remain limited.

Advantageously, the power-up circuit 3 is coupled to the limiter circuit 4 for cutting off the current limiting function as the transistor is turned on again.

During a negative surge transient, i.e. with the output OUT at a lower potential than the ground reference GND, the transient energy is dumped to the ground reference GND through the intrinsic diode DP of the power transistor PW, be the transistor PW in the on or the off state.

During a positive surge transient, the following occurs: with the power transistor PW in the off state, the voltage at the output OUT will rise to the operation level of the zener diode DZ, which functions to turn on again the power transistor and allow of fast de-magnetization with inductive loads. However, since the current required by the surge transient is larger than the limited current, lacking the transistor T1, the output voltage would continue to rise up to the breakdown voltage, on exceeding which the device is destroyed. By providing the transistor T1 and the current mirror circuit T3, T4, the current limiting function is disabled upon the output exceeding a given threshold, so that the power transistor PW can supply all the current required by the surge transient and dissipate the energy thereto.

With the power transistor PW in the on state, upon the occurrence of the surge transient, the current limiting circuit 4 will tend to turn off the transistor PW, and the voltage at the output OUT will rise. The transistor T1 provided causes, by disabling the current limiting function, the voltage at the output OUT to never rise above a given threshold. Here again, the power transistor PW supplies all the current required by the surge transient and dissipates the transient energy.

Referring to either FIG. 2 or 3, the method for protecting an output terminal OUT of a power actuator from a voltage transient, according to the invention will now be described.

As already brought out by the foregoing description, the method of this invention provides for the:

utilization of the power transistor intrinsic diode DP for dumping the transient energy to one of the supply generator terminals (VS in the circuit of FIG. 2, GND in the circuit of FIG. 3) during a transient having a given polarity; and utilization of the power transistor PW restoration feature to the on state for dumping the energy thereinto, during a transient having the opposite polarity from the former, while simultaneously inhibiting the current limiting function.

The transistor PW is turned on again, and the current limiting circuit 4 inhibited, by the following steps:

a) generating an electric signal which is substantially proportional to the voltage appearing at the output terminal OUT of the actuator;

b) driving the control terminal G of the power transistor PW by means of said electric signal, and causing said transistor to conduct, while simultaneously disabling the current limiting circuit 4 when the output voltage exceeds a predetermined threshold; and c) allowing the transient energy to be dissipated to the power transistor PW.

Thus, the use of this invention allows the output of a power actuator to be protected by a circuit arrangement which is fully integrated, with no external components added.

Figure 4:
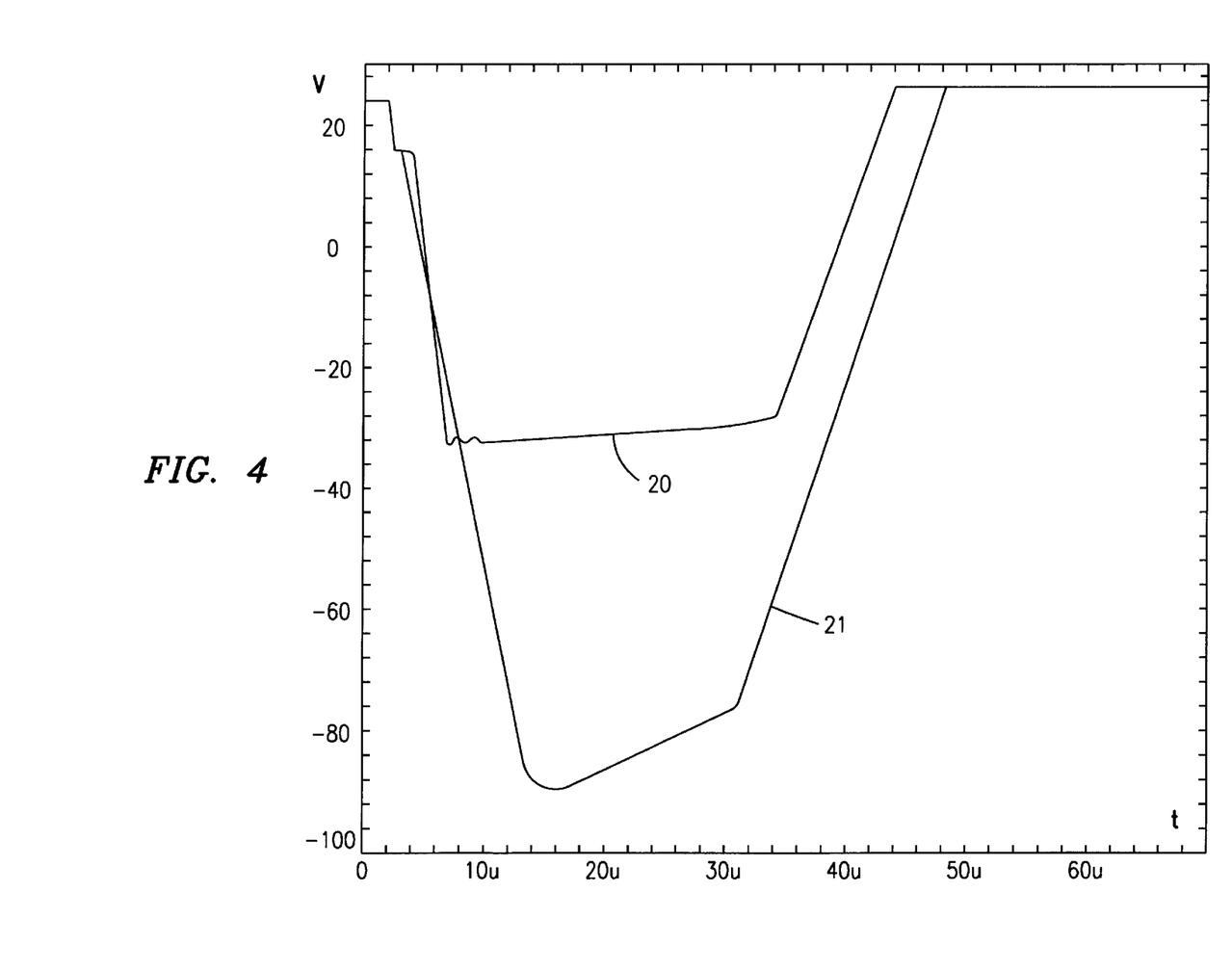
FIG. 4 illustrates the behavior of the output voltages from the circuits of FIGS. 1 and 2 vs. time.

Plotted in FIG. 4 is the pattern of the output voltage Vout on the occurrence of a surge type of transient at the output terminal, for an actuator of conventional design on the curve 21, and for an actuator according to this invention on the curve 20.

The difference is easily perceived:

in the actuator protected in accordance with this invention—curve 20—the voltage value remains in all cases limited, above a given threshold of approximately −30 volts in this Figure, at which the protector becomes operative;

in the prior art actuator, the voltage at the output terminal follows the same pattern as the transient, dropping to as low as −90 volts, a value that is sure to deteriorate the power transistor PW.

Figure 5:
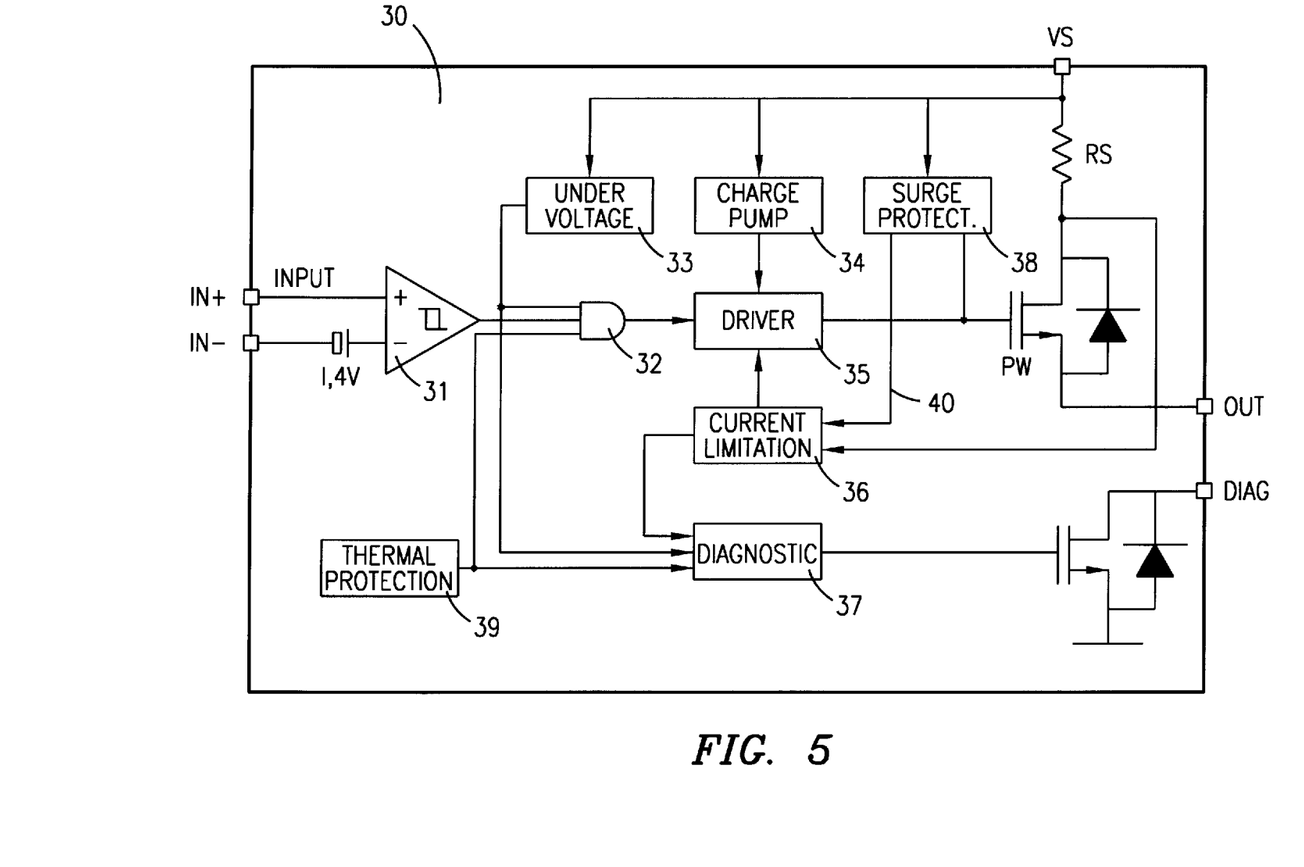
FIG. 5 is a block diagram of an intelligent power actuator provided with a protector from voltage transients of the surge type, in accordance with the invention.

FIG. 5 is a block diagram of an intelligent power actuator 30 protected from voltage transients of the surge type, in accordance with this invention.

The final stage of the actuator comprises a power transistor PW, a limiter circuit 36 for limiting the maximum current, and a circuit 38 for protecting the final transistor PW against surge transients, in accordance with the invention.

The current limiting circuit 36 senses the output current through the sense resistor RS put in series with the main conduction path of the power transistor PW.

The input signal (IN+, IN−) is taken to the gate terminal of the power transistor PW through a series of an input comparator 31, an enable NAND gate 32 with three inputs, and a driver circuit 35. The current limiting circuit 36, being coupled to the protection circuit 38 providing protection against transients of the surge type through the line 40, will act on the driver circuit to limit the final transistor PW current.

Also shown in the block diagram 30 are a circuit 33 for monitoring the supply voltage, and a circuit 39 for protecting the device thermally, both circuits being coupled to the enable NAND gate 32.

A diagnostics circuit 37, coupled to the current limiting circuit 36, the circuit 33 monitoring the supply voltage, and the circuit 39 thermally protecting the device, generates a signal DIAG to report the internal state of the circuit to the device outside.

What is claimed is:

1. A final stage of a power actuator, having its output protected against voltage transients and comprising:

a power transistor which has a control terminal, a first main conduction terminal coupled to one pole of a supply generator, and a second main conduction terminal coupled to an output terminal of the actuator, said first and second terminals defining a main conduction path of the power transistor;

a limiter circuit limiting the maximum current from the power transistor and having at least a first input coupled to the main conduction path and an output coupled to the control terminal of the power transistor; and a power-up circuit for turning on again the power transistor, and being coupled to the control terminal of the power transistor and driven by means of an electric signal which is proportional to the voltage appearing at the output terminal of the actuator;

wherein, the power-up circuit for the power transistor is coupled to the current limiting circuit to inhibit the current limiting function as the transistor is turned on again.

2. A final stage according to claim 1, wherein the power-up circuit for the power transistor comprises:

a zener diode having an anode terminal connected to the control terminal of the power transistor, and a cathode terminal; and a transistor having first and second terminals and a control terminal, the first terminal being connected to said pole of the supply generator, the control terminal being connected to the cathode terminal of the zener diode, and the second terminal being connected to an inhibit input of the maximum current limiting circuit.

3. A final stage according to claim 1, wherein the power-up circuit for the power transistor comprises:

a zener diode having an anode terminal connected to the control terminal of the power transistor, and a cathode terminal; and a transistor having first and second terminals and a control terminal, the first terminal being connected to the output terminal of the actuator, the control terminal being connected to the cathode terminal of the zener diode, and the second terminal being connected to an inhibit input of the maximum current limiting circuit.

4. A final stage according to claim 3, wherein the second terminal of the transistor is coupled to the inhibit input of the limiter circuit through a current mirror circuit.

5. A final stage according to claim 1, wherein the final transistor is a power transistor of the MOS type and includes a parasitic diode, intrinsic to its structure and electrically connected between the first and second main conduction terminals.

6. An intelligent power actuator comprising at least one final stage with a protected output against voltage transients comprising:

a power transistor which has a control terminal, a first main conduction terminal coupled to one pole of a supply generator, and a second main conduction terminal coupled to an output terminal of the actuator, said first and second terminals defining a main conduction path of the power transistor;

a limiter circuit limiting the maximum current from the power transistor and having at least a first input coupled to the main conduction path and an output coupled to the control terminal of the power transistor; and a power-up circuit for turning on again the power transistor, and being coupled to the control terminal of the power transistor and driven by means of an electric signal which is proportional to the voltage appearing at the output terminal of the actuator;

wherein, the power-up circuit for the power transistor is coupled to the current limiting circuit to inhibit the current limiting function as the transistor is turned on again.

7. An intelligent power actuator according to claim 6, wherein the power up circuit for the power transistor comprises:

a zener diode having an anode terminal connected to the control terminal of the power transistor, and a cathode terminal; and a transistor having first and second terminals and a control terminal, the first terminal being connected to said pole of the supply generator, the control terminal being connected to the cathode terminal of the zener diode, and the second terminal being connected to an inhibit input of the maximum current limiting circuit.

8. An intelligent power actuator according to claim 6, wherein the power up circuit for the power transistor comprises:

a zener diode having an anode terminal connected to the control terminal of the power transistor, and a cathode terminal; and a transistor having first and second terminals and a control terminal, the first terminal being connected to the output terminal of the actuator, the control terminal being connected to the cathode terminal of the zener diode, and the second terminal being connected to an inhibit input of the maximum current limiting circuit.

9. An intelligent power actuator according to claim 8, wherein the second terminal of the transistor is coupled to the inhibit input of the limiter circuit through a current mirror circuit.

10. An intelligent power actuator according to claim 6, wherein the final transistor is a power transistor of the MOS type and includes a parasitic diode, intrinsic to its structure and electrically connected between the first and second main conduction terminals.

* * * * *

UNITED STATES PATENT AND TRADEMARK OFFICE
CERTIFICATE OF CORRECTION

PATENT NO. : 5,831,466
DATED : November 3, 1998
INVENTOR(S) : Francesco Pulvirenti, et al.

It is certified that error appears in the above-identified patent and that said Letters Patent is hereby corrected as shown below:

column 5, line 52, "NOS" should be --MOS--;

Signed and Sealed this

Ninth Day of February, 1999

Attest:

Attesting Officer

Acting Commissioner of Patents and Trademarks